(12) United States Patent
Tezcan et al.

(10) Patent No.: US 8,647,920 B2
(45) Date of Patent: Feb. 11, 2014

(54) METHOD FOR FORMING 3D-INTERCONNECT STRUCTURES WITH AIRGAPS

(75) Inventors: Deniz Sabuncuoglu Tezcan, Neerwinden (BE); Yann Civale, Leuven (BE); Eric Beyne, Leuven (BE)

(73) Assignee: IMEC VZW (BE)

(*) Notice: Subject to any disclaimer, the term of this patent is extended or adjusted under 35 U.S.C. 154(b) by 0 days.

(21) Appl. No.: 13/183,315

(22) Filed: Jul. 14, 2011

(65) Prior Publication Data

US 2012/0013022 A1 Jan. 19, 2012

Related U.S. Application Data

(60) Provisional application No. 61/365,160, filed on Jul. 16, 2010.

(51) Int. Cl.

| | | |
|---|---|---|
| H01L 21/00 | (2006.01) | |
| H01L 21/4763 | (2006.01) | |
| H01L 21/44 | (2006.01) | |
| H01L 21/302 | (2006.01) | |
| H01L 21/461 | (2006.01) | |
| H01L 29/06 | (2006.01) | |
| H01L 23/48 | (2006.01) | |
| H01L 23/52 | (2006.01) | |
| H01L 29/40 | (2006.01) | |

(52) U.S. Cl.
USPC ........... 438/106; 438/639; 438/667; 438/712; 257/626; 257/737

(58) Field of Classification Search
USPC .......................................................... 257/774
See application file for complete search history.

(56) References Cited

U.S. PATENT DOCUMENTS

| | | | | |
|---|---|---|---|---|
| 6,228,763 | B1 * | 5/2001 | Lee | 438/639 |
| 8,039,393 | B2 * | 10/2011 | Wang et al. | 438/667 |
| 2003/0205782 | A1 * | 11/2003 | Ireland et al. | 257/626 |
| 2007/0048896 | A1 * | 3/2007 | Andry et al. | 438/106 |
| 2010/0264538 | A1 * | 10/2010 | Swinnen et al. | 257/737 |
| 2011/0076853 | A1 * | 3/2011 | Mao | 438/712 |

* cited by examiner

*Primary Examiner* — Fernando L Toledo
*Assistant Examiner* — Valerie N Newton
(74) *Attorney, Agent, or Firm* — Knobbe, Martens, Olson & Bear, LLP.

(57) ABSTRACT

Ultra-low capacitance interconnect structures, preferably Through Silicon Via (TSV) interconnects and methods for fabricating said interconnects are disclosed. The fabrication method comprises the steps of providing a substrate having a first main surface, producing at least one hollow trench-like structure therein from the first main surface, said trench-like structure surrounding an inner pillar structure of substrate material, depositing a dielectric liner which pinches off said hollow trench-like structure at the first main surface such that an airgap is created in the center of hollow trench-like structure and further creating a TSV hole and filling it at least partly with conductive material.

23 Claims, 15 Drawing Sheets

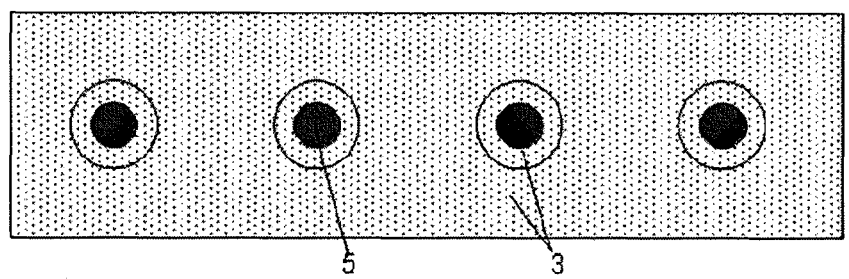
FIG. 1a
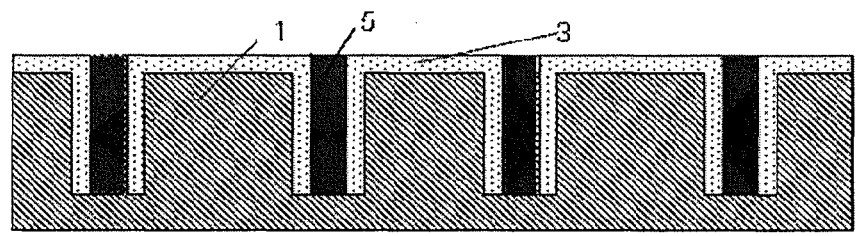
FIG. 1b
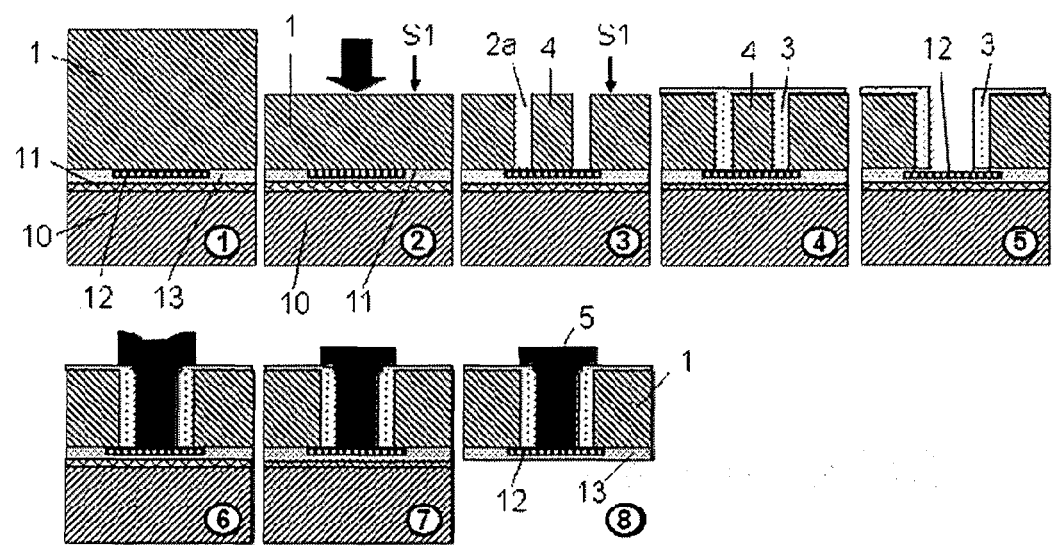
FIG. 2 – prior art

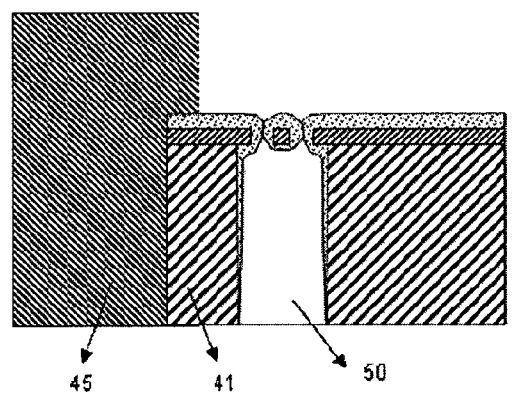
FIG. 11f
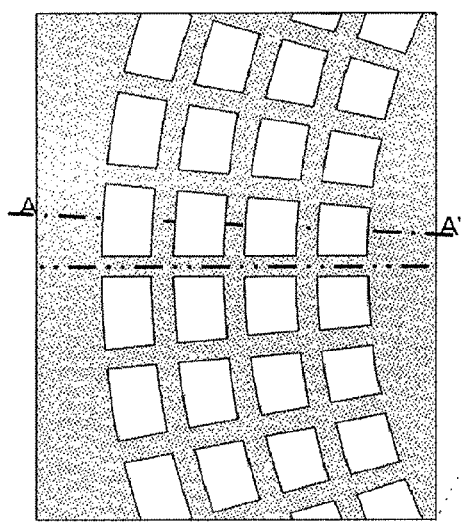 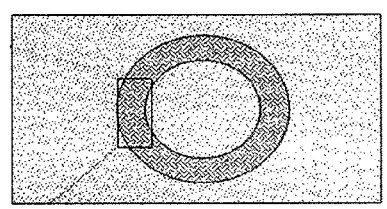
FIG. 12a                    FIG. 12b

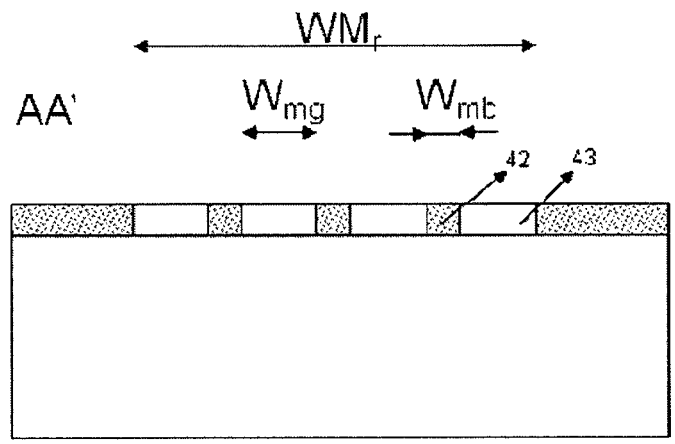
FIG. 12c
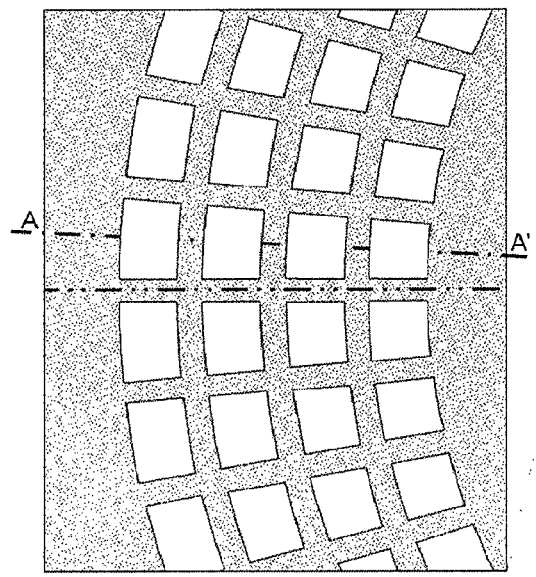 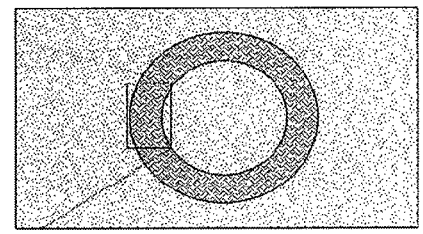
FIG. 13a  FIG. 13b

METHOD FOR FORMING 3D-INTERCONNECT STRUCTURES WITH AIRGAPS

CROSS-REFERENCE TO RELATED APPLICATION

This application claims the benefit under 35 U.S.C. §119 (e) of U.S. provisional application Ser. No. 61/365,160, filed Jul. 16, 2010, the disclosure of which is hereby expressly incorporated by reference in its entirety and is hereby expressly made a portion of this application.

FIELD OF THE INVENTION

The disclosure relates to the field of forming interconnect structures such as Through Silicon Vias (TSV) to be used in the stacking of semiconductor devices. More particularly, the present disclosure relates to methods of forming airgaps whereby said airgaps are surrounding at least part of a TSV interconnect structure in order to reduce the capacitance of the interconnect structure. The disclosure further relates to devices thus obtained.

BACKGROUND OF THE INVENTION

With the continued scaling of IC technology, due to the large amount of electronic circuits on a small area, the density of chip input/output connection pads (I/O's) continues to increase. This leads to an increasing bandwidth of interconnects between integrated circuits (IC's) and/or other system elements. For short interconnects, electrical signal lines maintain the highest capacity and speed. In order to keep up with the increasing speed and density requirements, system in a package (SIP) technology is increasingly used. This creates the need for 3-dimensional interconnects.

An example of a suitable 3-dimensional interconnect, so called "3D-Through Silicon Via" also referred to as "3D-TSV," is disclosed in WO 2009 050207. In this approach, a ring structure is provided in a substrate wherein the ring structure is filled with a dielectric material and wherein the ring structure is surrounding an inner pillar structure made of conductive material which is functioning as the through silicon via interconnect structure. The dielectric material applied in the ring structure can be a spin-on or spray-on or Chemical Vapor Deposited (CVD) deposited polymer as well as a deposited/grown oxide or nitride. This through silicon via approach is schematically shown in FIG. 1. However even with this approach the TSV capacitance is still too high and not sufficient for certain applications. Hence there is still room to improve the TSV capacitance significantly to obtain an ultra-low capacitance TSV.

SUMMARY OF THE INVENTION

It is an object to provide a good method for manufacturing said 3D-TSV semiconductor devices making use of existing processing technology and allowing for an insulating liner process flow that is applicable to a wide range of silicon thicknesses. It is an advantage of embodiments of the present disclosure to provide Through Silicon Via interconnects for use in 3D stacked semiconductor devices, said 3D-Through Silicon Vias (3D-TSVs) that have an isolation liner process independent of the silicon substrate thickness and having a significant low capacitance to the silicon substrate. The 3D-TSV interconnects of the present disclosure are also referred to as ultra-low capacitance TSV interconnects.

It is an advantage of embodiments of the present disclosure to achieve 3D-TSV having an ultra-low capacitance, preferably well below 50 fF and even lower than 10 fF.

The present disclosure solves the problem of high capacitance by forming airgaps during the processing of said 3D-TSV, whereby said airgaps are at least partly surrounding said 3D-TSV, preferably said airgaps are formed in a trench-like structure, more preferably a trench-like ring structure, which is surrounding said 3D-TSV interconnect. Said 3D-TSV interconnect is preferably a conductive pillar, more preferably a conductive pillar comprising a metal such as copper or nickel or tungsten. The metal is preferably deposited using electrochemical deposition (ECD) techniques. Alternatively the metal may be deposited using Chemical Vapor deposition (CVD).

The above objective is accomplished by a method and device according to the present disclosure.

The present disclosure relates to a semiconductor device and a method for making said device, the semiconductor device comprising at least one 3D-TSV interconnect and a surrounding trench-like structure, more preferably a trench-like ring structure (also referred to as "donut" structure) which comprises at least one airgap. Said 3D-TSV interconnect is preferably a pillar made of conductive material and being connected to the interconnect structures of for example another semiconductor substrate or another semiconductor device and/or another level of interconnect structures within the same semiconductor device.

It is an advantage of embodiments according to the present disclosure that a 3D stacked semiconductor device can be obtained whereby the individual semiconductor devices (wafers, dies) are stacked and interconnected to each other in a vertical position by means of 3D-TSV interconnects having ultra-low capacitances such that these devices are very suitable for applications in the field of memory stacking of large numbers of parallel memory die (capacitance multiplied by number of die in stack), high speed digital and high frequency rf interconnects, such as rf-transceivers in mobile applications or high speed digital transceivers in telecommunication and high performance computation applications.

According to a first aspect of the disclosure, a substrate, preferably a semiconductor substrate comprising semiconductor active devices, is disclosed which comprises at least an interconnect structure which is surrounded by a spacer material, which is in turn surrounded by a trench-like structure with an airgap. Said interconnect structure is preferably a 3D-TSV in the form of a conductive inner pillar. Said surrounding trench-like structure is preferably a trench-like ring structure comprises at least an airgap and a sealing which pinches off the airgap. The ring structure may be any closed loop structure such as for example a circular loop, also referred to as circular ring, a polygonal closed loop, also referred to as polygonal ring, a square loop, also referred to as square ring. In some embodiments, the air gap may itself have a ring-like shape for surrounding the interconnect structure. The air gap may have a width parallel to a major surface of the substrate, in case of a ring-structure this may be the width, which is substantially smaller than the height of the air gap in a direction perpendicular to a major surface or the substrate.

According to preferred embodiments of the disclosure an additional surrounding spacer structure is situated in between the conductive inner pillar and the surrounding airgap structure. Said additional surrounding structure is preferably made of (remaining) substrate material.

According to preferred embodiments of the disclosure said additional surrounding structure has preferably a width Ws, which is preferably larger than 100 nm, Ws may be 0.5 µm, 1

μm, 1.5 μm, 2 μm, 2.5 μm, 3 μm, 4 μm, 5 μm or 10 μm. The thickness of this material has to be such that its strength is sufficient to support the thermo-mechanical forces resulting from the stresses in the inner TSV metallization during thermal excursions. Of particular importance is the circumferential or "hoop"-stress. This stress is a function of the TSV conductive inner pillar size and the width of the surrounding ring of material. This requirement may result in a minimum thickness of the ring surrounding the TSV conductive inner pillar of 2 to 5 μm in the case of Cu TSV in a Si substrate, depending on the via diameter used.

According to preferred embodiments of the disclosure said surrounding trench-like airgap structure has a width Wg in the range of 0.5 μm up to 5 μm, more preferably below 2 μm and is such that airgap pinch-off conditions are good, preferably optimal. The sidewalls of the trench structure may be fully or partially covered by the material used to pinch-off the airgap. The thickness of this layer on the sidewalls of the trench structure has to be at some positions in the trench less than halve the trench width to allow for an airgap to be formed in the trench.

According to preferred embodiments of the disclosure said sealing which pinches off the airgap is made of an insulating dielectric material such as an oxide, nitride, carbide, polymer or a combination of these materials.

According to preferred embodiments of the disclosure said conductive inner pillar structure is made of a material selected from copper (Cu), Nickel (Ni), tungsten (W), or any other metals used in the field. This metal may be deposited using electrochemical deposition (ECD) techniques or alternatively Chemical Vapor deposition (CVD). The conductive material can also be an alloy, an implanted semiconductor, conductive silicon, conducting polymers, carbon nanotubes. Alternatively a metal paste consisting of metallic particles and organic binders, e.g. Ag paste, can be applied. Alternatively Carbon nano tubes (CNT) and combination of CNT and Cu can be applied. Also combinations of above mentioned materials can be used. The step of depositing a conductive material allows to create an electrical interconnect with an external contact. This step can comprise various sub-steps. Extra layers underlying the conductive material or intermediate layers can be used. This can be for example improve the filling of the holes, adhesion of the conductive material, reduce the stress, prevent inter-diffusion of materials . . . .

In particular embodiments of the present disclosure, the inner pillar structure is completely made of conductive material, e.g. metal, so as to form a conductive pillar, e.g. metal pillar. Alternatively said inner pillar structure further comprises a barrier layer, to prevent diffusion of metals from the inner pillar structure into the spacer region Ws, and/or a seed layer which is deposited before filling the inner pillar with conductive material e.g. by electroplating. Said seed layer required when filling the pillar by electro-chemical deposition (electroplating) and should cover the whole surface of the side walls and bottom wall of the inner pillar structure (being conformal, continuous). Said barrier layer is preferably made of a material selected from Ta, Ti, TaN, TiN, TiW, RuTa and combinations thereof and is deposited by state of the art deposition techniques such as PVD and CVD and combinations thereof and said seed layer is preferably made of a material selected from Cu, Ni, Co, W, Mn and may be applied for instance by Chemical Vapor Deposition (CVD), Physical Vapor Deposition (sputtering) (PVD), Atomic Layer Deposition (ALD), Electro Chemical Deposition (ECD), as well as by any other method known in the art.

It is also possible that more than one electrical interconnect structure (conductive pillar) is formed within a single surrounding trench-like airgap structure. This means that parallel TSV are formed within the same trench-like (ring) structure.

According to a second aspect of the disclosure a method for the fabrication of at least one electrical interconnect in a substrate is disclosed. Said method starts with the step of providing a substrate (which may be thinned beforehand) made of substrate material and having a first main surface and then producing at least one hollow structure, preferably a trench-like structure, more preferably a trench-like ring structure in said first main surface of the substrate whereby the at least one hollow structure is surrounding an inner pillar structure of substrate material. In a next step a dielectric liner is deposited which pinches off the trench-like (ring) structure at the surface of the substrate such that an airgap is created in the center of said structure. In some embodiments, in this way an airgap having a ring-like shape may be formed. In a next step a hole is created in the inner pillar thereby creating a Through Silicon Via (TSV) hole having a bottom surface and an additional surrounding structure made of material, e.g. (remaining) substrate material, between the TSV hole and the trench-like structure with airgap. Said TSV hole is then at least partly filled with a conductive material thereby creating an electrical interconnect structure suitable for forming an electrical path from the bottom surface of the hole up until the surface of the substrate.

The step of creating a (TSV) hole is preferably performed using reactive ion etching, this may be a pulsed etching technique comprising alternating steps of isotropic etching and passivation (such as for example the Bossch process).

According to alternative and also preferred embodiments of the disclosure a layer, preferably a mask layer, comprising well defined openings is deposited onto the surface of the substrate before the step of fabricating the at least one hollow trench-like (ring) structure. Said layer may be an oxide or nitride layer and is having openings with a width $W_{mg}$ and a spacing $W_{mb}$ at the locations where the trench-like (ring) structure and airgap are to be defined. The spacing $W_{mb}$ is maximum 2 times the undercut (scallop) produced during the DRIE process, preferably less. Said undercut depends on the $W_{mg}$ and the DRIE recipe selected. Typically the larger the $W_{mg}$ and the higher the etch rate, the higher the undercut will be. In this case the hollow trench-like (ring) structure is created by etching through the openings of the mask layer using a pulsed etching technique comprising alternating steps of isotropic etching and passivation and wherein said steps are repeated (also referred to as "Bosch cycles") until the desired depth of the hollow ring structure is reached. Said alternating etching-passivation process is preferably using an $SF_6$ based plasma etching step alternated with a $C_4F_8$ based plasma passivation step, optionally further comprising oxygen and/or inert gases in either or both steps. This process is characterized by an undercut of the mask layer and so-called scalloping of the sidewalls. This undercut should be such that it is larger than halve of the size of the spacing $W_{mb}$ of the openings in the masking layers. This will result in a complete removal of substrate material below the closely spaced openings in the masking layers. Repeating the process over multiple cycles will result in a progressive realization of the trench, a process which is finalized when reaching the opposite site of the substrate material and the interconnect layers of the active devices. At this point, the masking layer with holes $W_{mg}$ and spacing $W_{mb}$ is a porous membrane across the trench structure.

In a next step, a dielectric layer is deposited to pinch of the holes in the membrane masking the etched trench. According to preferred embodiments of the disclosure the deposited dielectric liner has preferably a minimal lateral thickness which is larger than the half width of the openings $W_{mg}$ in the membrane of the ring structure to ensure a proper sealing of the air gap in the trench structure.

After sealing the air-gap trench, the TSV interconnect is formed in a way identical to the first aspect of the disclosure.

According to preferred embodiments of the disclosure the step of at least partly filling the TSV hole with a conductive material is performed. Said conductive material may be a metal such as Copper (Cu), Nickel (Ni), tungsten (W) or any other metals and/or alloy of metals using electrochemical deposition (ECD) techniques or alternatively Chemical Vapor deposition (CVD).) Also alternative conductive materials may be used such as an implanted semiconductor, conductive silicon, conducting polymers, carbon nanotubes. Alternatively a metal paste consisting of metallic particles and organic binders, e.g. Ag paste, can be applied. Alternatively Carbon nano tubes (CNT) and combination of CNT and Cu can be applied.

Said TSV interconnect structure may then be further provided with a solder ball or bump. Thinning of the substrate (preferably down to 50 μm-100 μm) may also take place before the creation of TSV interconnects.

Particular and preferred aspects of the disclosure are set out in the accompanying independent and dependent claims. Features from the dependent claims may be combined with features of the independent claims and with features of other dependent claims as appropriate and not merely as explicitly set out in the claims. These and other aspects of the disclosure will be apparent from and elucidated with reference to the embodiment(s) described hereinafter.

BRIEF DESCRIPTION OF THE DRAWINGS

FIGS. 1B and 1B illustrate a top view (FIG. 1A) and side view (FIG. 1B) of a semiconductor substrate having state of the art 3D-TSV interconnects, said 3D-TSV comprising a conductive pillar acting as TSV and which is surrounded by a ring structure filled with a polymer or dielectric material.

FIG. 2 illustrates the different processing steps used to provide the state of the art 3D-TSV illustrated in FIG. 1.

FIG. 8A illustrates a trench-like structure with straight sidewalls while FIG. 8B illustrates a trench-like structure with sloped sidewalls.

FIGS. 11A-11F illustrate processing steps according to a preferred embodiment of the present disclosure to fabricate a 3D-TSV interconnect surrounded by a trench-like structure comprising an airgap using a pulsed etching technique comprising alternating steps of isotropic etching and passivation and wherein said steps are repeated until the desired depth of the (hollow) surrounding structure is reached and whereby the airgap pinch-off is achieved by depositing a liner.

FIGS. 12A-C illustrate a top view (FIGS. 12A and 12B) of a layer comprising well defined openings to provide a hollow trench-like (ring) structure using a pulsed etching technique comprising alternating steps of isotropic etching and passivation according to a preferred embodiment of the present disclosure. FIG. 12C illustrates a vertical cross section illustrating the width of the openings.

FIGS. 13A-C illustrate a top view (FIGS. 13A and 13B) of the layer comprising well defined openings to provide a hollow trench-like (ring) structure using a pulsed etching technique comprising alternating steps of isotropic etching and passivation according to a preferred embodiment of the present disclosure. FIG. 13C illustrates a vertical cross section illustrating the removal of substrate material through the openings to create a hollow structure underneath the perforated layer.

Figure 3A:
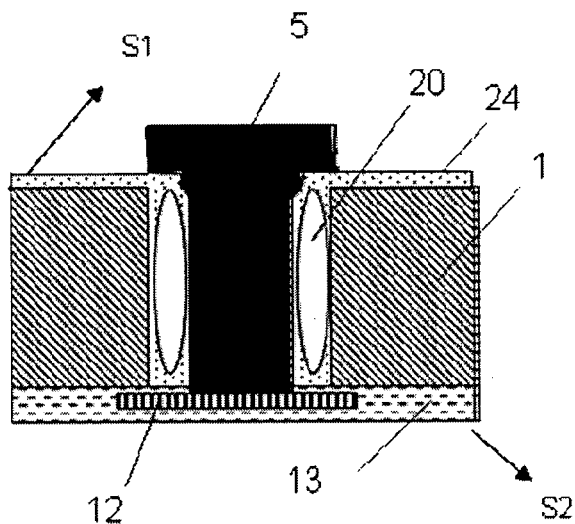
FIG. 3A illustrates a Through Silicon Via (TSV) interconnect according to embodiments of the present disclosure in the form of a conductive inner pillar structure 5 with a trench-like structure with air-gap 20 e.g. in the form of a ring structure and wherein said trench-like structure is comprising an airgap and a sealing which pinches off the airgap. A dielectric material used to pinch of the airgap is used as spacer material between the TSV conductive pillar structure and the air-gap.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

Figure 5:
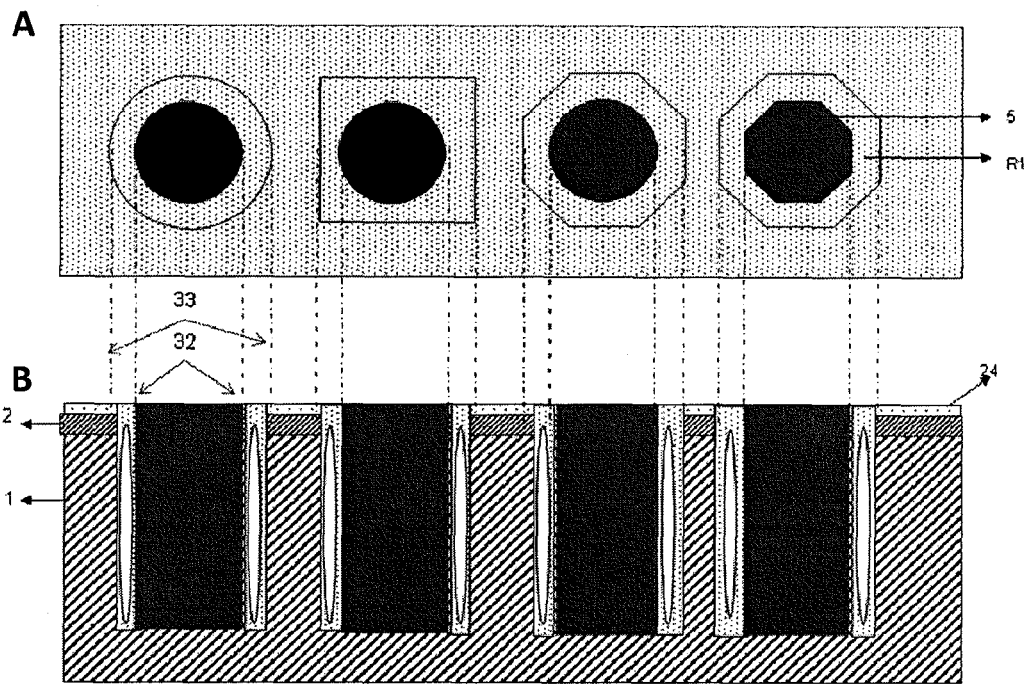
FIG. 5 part A illustrates a horizontal cross section and FIG. 5 part B a vertical cross section of a Through Silicon Via (TSV) interconnect according to embodiments of the present disclosure in the form of a conductive inner pillar structure with a surrounding trench-like structure comprising an airgap whereby said surrounding trench-like structure can be circular or more oval in cross-section substantially parallel with the surface of the substrate, or can even have a shape with corners or rounded corners (for example can be a square, a hexagon, or more generally a polygon; the polygon shapes can be regular or irregular . . . ).
Figure 6:
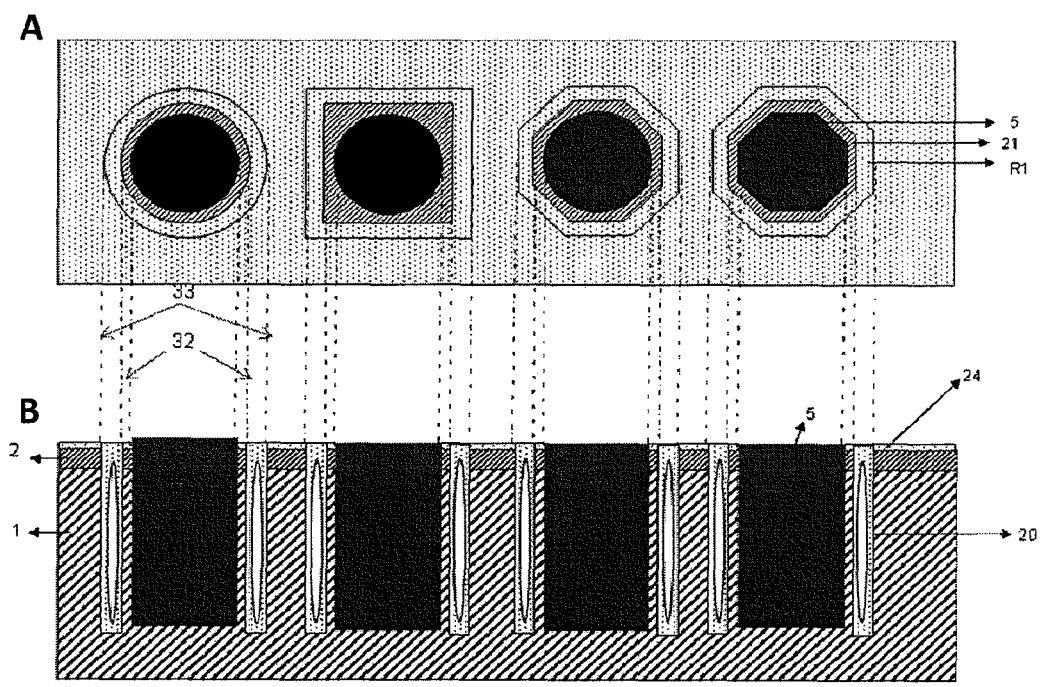
FIG. 6 part A illustrates a horizontal cross section and FIG. 6 part B a vertical cross section of a Through Silicon Via (TSV) interconnect according to embodiments of the present disclosure in the form of a conductive inner pillar structure with a first surrounding trench-like structure comprising an airgap and an additional surrounding structure situated in between said TSV and surrounding trench-like structure with airgap and whereby said surrounding structures can be circular or more oval in cross-section substantially parallel with the surface of the substrate, or can even have a shape with corners or rounded corners (for example can be a square, a hexagon, or more generally a polygon; the polygon shapes can be regular or irregular.

DEFINITIONS

Where reference is made in embodiments of the present disclosure to "a surrounding trench-like structure" or a "structure surrounding the TSV" this may refer to a structure with any geometrical shape having a specific width $W_g$ and $W_s$ that is surrounding the actual final conductive part of the TSV. Examples are a circular ring, polygonal rings, or square rings as illustrated in FIGS. 5 and 6. In case the surrounding structure is a ring structure surrounding the TSV this is often referred to in the state of the art as the "donut-approach." In preferred embodiments the surrounding trench-like structure is separated from the TSV by remaining substrate (e.g. Si) material having at least a critical width $W_s$, which is preferably larger than 100 nm, said remaining substrate structure is also referred to in this disclosure as an additional surrounding structure.

Where in embodiments of the present disclosure reference is made to a pulsed etching it refers to a process in which an etching step is alternated with a deposition step and this is repeated to achieve nearly vertical structures. It is also referred to as the "The Bosch process." The plasma contains some ions, which attack the wafer from a nearly vertical direction. For silicon, this pulsed etching preferably uses sulfur hexafluoride source gas [$SF_6$], while for the deposition of a chemically inert passivation layer, preferably a [$C_4F_8$] source gas (optionally further including oxygen and/or inert gases) is used and each pulsed phase preferably lasts for several seconds. The passivation layer protects the entire substrate from further chemical attack and prevents further (lateral) etching. However, during the etching phase, the directional ions that bombard the substrate attack the passivation layer at the bottom of the trench (but not along the sides). The etch/deposition steps are repeated many times over resulting in a large number of very small isotropic etch steps taking place only at the bottom of the etched pits. To etch through a 0.5 mm thick silicon wafer, for example, 100-1000 etch/deposit steps are needed. The cycle time can be adjusted: short cycles yield smoother walls, and long cycles yield a higher etch rate.

DETAILED DESCRIPTION OF ILLUSTRATIVE EMBODIMENTS

Embodiments of the present disclosure relate to electrical interconnects having ultra-low capacitance, more preferably to through-hole or Through Silicon Via (TSV) interconnects and methods for producing said electrical through-hole interconnects. Said interconnects are preferably used for making 3D stacked semiconductor wafers and chips, e.g. Si wafers and chips, and for packaging applications of e.g. MEMS devices.

According to a first aspect, the present disclosure is related to an electrical interconnect structure with good capacitance, more particular to an ultra-low capacitance (preferably lower than 50 fF) 3D-TSV interconnect structure. FIG. 3 illustrates such an interconnect structure in the form of a conductive inner pillar structure with a surrounding trench-like structure e.g. in the form of a ring structure and wherein said trench-like structure comprises an airgap and a sealing which pinches off said air gap. The air gap also may have a ring-like shape, such that the air gap also may be surrounding, the conductive inner pillar structure. The air gap may have a height in a direction perpendicular to a major or main surface of the substrate that is substantially higher than a thickness of the air gap in a direction parallel to a major or main surface of the substrate.

FIGS. 1A and 1B illustrate a semiconductor substrate 1 having state of the art 3D-TSV interconnects 5 wherein said 3D-TSV (5) comprises a conductive pillar acting as a TSV interconnect and a surrounding ring structure filled with a polymer or dielectric material (3). A process flow according to this state of the art 3D-TSV structure is illustrated in FIG. 2. The method is based on producing a ring-structure 2a e.g. a ring-trench in the substrate (1) at the side of the surface (S1). This is done by using a photoresist layer on the first main surface (S1) in which a ring-like trench is defined, e.g. by using state of the art lithography techniques on the first main surface (S1). Then the ring-structure (2a) is fabricated in the substrate (1) by removing substrate material, e.g. by etching a circular trench in the substrate (1) e.g. Si substrate etch, thus producing an inner pillar structure (4) of substrate material. The ring-structure (2a) is then filled with a dielectric material (3), preferably a fluid, hereby also providing a layer of dielectric material (3) on the surface (S1) of the substrate. The inner pillar structure is then replaced with a conductive material (5). However the TSV capacitance of this state of the art approach is simulated to be ~30 fF which is not low enough for certain applications.

Figure 3B:
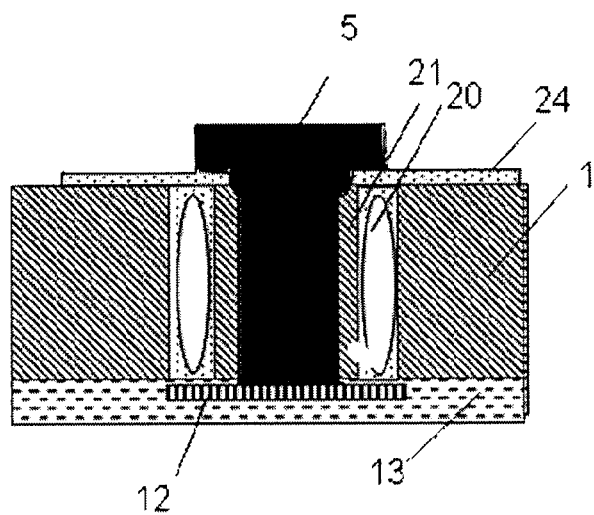
FIG. 3B illustrates a Through Silicon Via (TSV) interconnect according to embodiments of the present disclosure in the form of a conductive inner pillar structure 5 with a surrounding spacer structure made of the substrate material 21 and an airgap trench-like structure 20 e.g. in the form of a ring structure and wherein said trench-like structure is comprising an airgap and a sealing which pinches off the airgap.

FIG. 3A-3B illustrates a substrate comprising an electrical interconnect structure according to embodiments of the present disclosure. The interconnect structure according to embodiments of the present disclosure comprises a conductive inner pillar structure (5) surrounded by a trench-like structure such as a ring structure (R1) wherein said structure (R1) comprises at least one airgap (20) and a sealing material (24). The airgap also may have a ring-like shape so as to surround the conductive inner pillar structure.

Said interconnect structure (5) may be a Through Silicon Via (TSV) having a high aspect ratio (ratio of the depth of TSV to the width of the TSV in the substrate), preferably said aspect ratio is 0.5, 1, 2, 5, 8, 10 or 20, more preferably said aspect ratio is in the range of 5 up to 10. The substrate thickness and hence TSV depth in the substrate is preferably 150 µm, 300 µm, 500 µm, 725 µm and any value in between these values. More preferably the depth in the substrate is 20 µm up to 100 µm, most preferably a depth of around 50 µm. The conductive pillar of the TSV is preferably having a width of 1 µm diameter up to 100 µm in the range of 5 µm-25 µm, more preferably around 10 µm. The width of the TSV interconnect comprising the trench-like structure and the conductive pillar is 3 µm, 5 µm, 10 µm, 35 µm, 50 µm, 100 µm, 150 µm or any value in between.

Said trench-like structure (R1) surrounding said interconnect structure (5) comprises an airgap (20) and a sealing material (24) which pinches off the airgap (20). Said sealing material is preferably provided by depositing a liner (24) made of sealing material.

The sealing material is preferably provided by depositing a liner (24) made of sealing material, more preferably a liner made of a dielectric material such as an oxide or nitride or alternatively a polymer. Said liner (24) is preferably deposited using a deposition technique selected from PE-CVD or PE-ALD, more preferably low temperature PE-CVD at temperatures typically <200° C. In case the liner is a polymer, it may be deposited using spin coating or lamination. Typically deposition of a liner (24) having a thickness onto the substrate surface of more than 1 μm is sufficient to achieve airgap pinch-off in the trench-like structure. For example depositing around 4.5 μm liner (e.g. oxide) thickness onto the substrate surface is sufficient to reach pinch-off on 2.5 μm wide trenches. The thickness of the liner (24) at the bottom of the trench after pinch-off is then typically in the range of 300 nm-400 nm.

In particular embodiments the average width of the trench-like structure (ring) structure (R1) is larger than 0.5 μm. In particular embodiments of the present disclosure, the average width of the trench-like (ring) structure (R1) is smaller than 20 μm, or smaller than 10 μm, or smaller than 7 μm, or smaller than 6 μm or below 5 μm or below 4 μm, or can vary between 20 μm and 0.5 μm, between 10 μm and 0.5 μm, between 15 μm and 2 μm or between 10 μm and 3 μm or between 7 μm and 5 μm. The trench-like structure (R1) is preferably a ring structure but alternative geometrical surrounding structures as shown in FIG. 5 and FIG. 6 are possible.

Figure 8A:
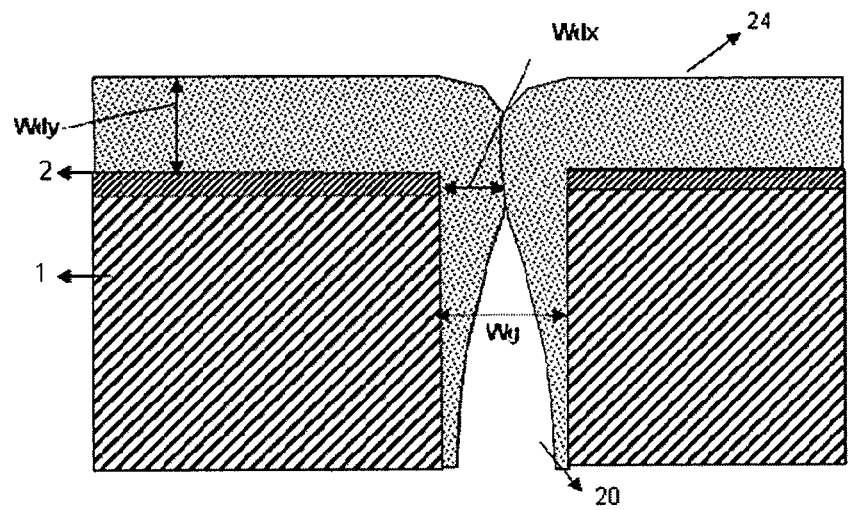
FIGS. 8A and 8B illustrate the airgap pinch-off according to embodiments of the present disclosure achieved by depositing a liner in the hollow surrounding trench-like structure.
Figure 8B:
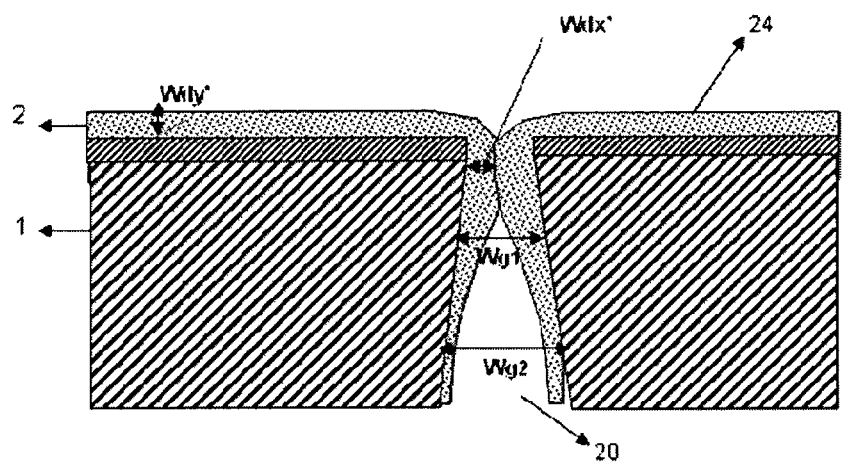

According to one embodiment and as illustrated in FIG. 8B the trench-like structure (R1) is having sloped sidewalls (such that the upper width $Wg_1$ is larger than the lower width $Wg_2$ of the trench) in order to position the airgap (20) pinch-off by the liner material deeper in the trench and to avoid pinch-off at a level above the substrate surface (S1). A trench-like structure having sloped sidewalls requires less liner material (smaller thickness $Wd_{y'}$) to be deposited onto the surface of the substrate to achieve airgap pinch-off. A trench-like structure having sloped sidewalls as illustrated in FIG. 8B has the additional advantage that pinch off is below the substrate surface and the airgap will not reopen during chemical Mechanical Polishing (CMP) steps performed later on to remove liner material from the field area.

According to preferred embodiments, the conductive pillar (5) is a Through Silicon Via (TSV) and is at least comprising a material selected from the group consisting of conductive silicon, Cu, Al, and W and optionally comprises a seed layer (not illustrated in the drawings). Furthermore said conductive pillar may comprise a barrier material (layer) at the outer sidewalls of the conductive pillar (not illustrated in the drawings). Said barrier material is preferably selected from materials such as Ta, Ti, TaN, TiN, RuTa, TiW, deposited by state of the art deposition techniques such as PVD and CVD and combinations thereof.

Figure 4A:
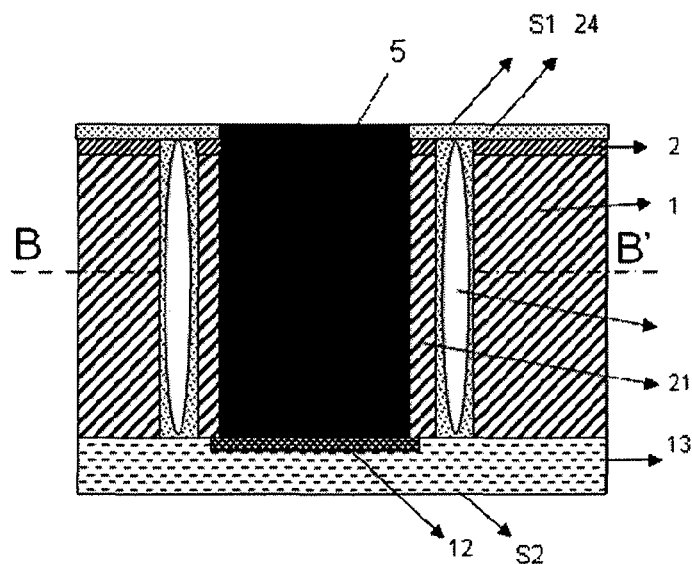
FIG. 4A illustrates a vertical cross section and FIG. 4B a horizontal cross section of a Through Silicon Via (TSV) interconnect according to embodiments of the present disclosure in the form of a conductive inner pillar structure with a surrounding trench-like structure comprising an airgap and an additional surrounding structure situated in between said TSV and trench-like surrounding structure with airgap.

According to preferred embodiments and as illustrated in FIG. 3B and FIG. 4A, there is substrate material left in between the conductive pillar (5) and the trench-like structure (R1) comprising an airgap (20) thereby creating an additional surrounding structure (21). Said additional surrounding structure (21) is giving mechanical support to the conductive pillar (5) and avoids damage to the airgap (20) during the patterning (etching) of the hole (23) to create the conductive pillar (5) in the substrate (1). Said additional surrounding structure (21) is preferably made of substrate material and has preferably a width Ws, which is preferably larger than 100 nm. Preferably a minimum thickness of the additional surrounding structure is in range of 2 to 5 μm in the case of Cu TSV in a Si substrate and is further depending on the via diameter used.

Figure 9A:
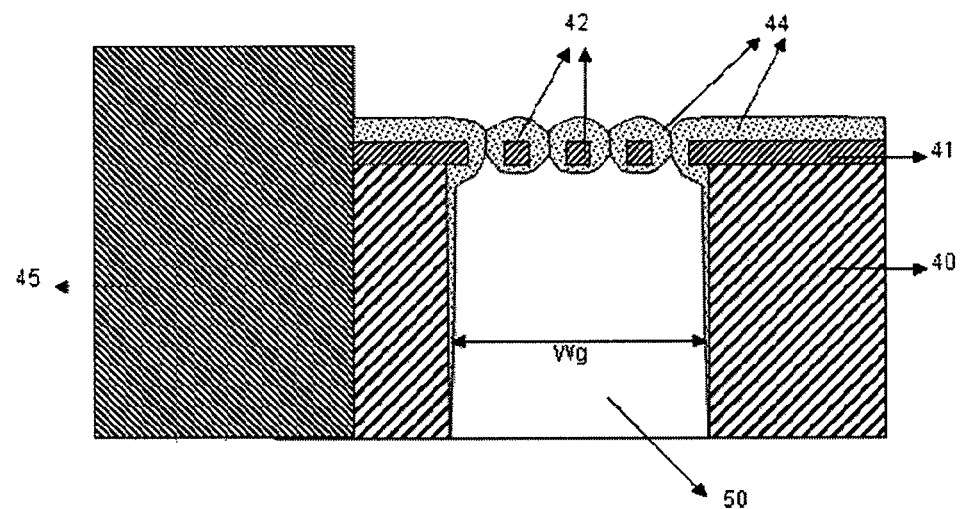
FIGS. 9A and 9B illustrate the airgap pinch-off according to embodiments of the present disclosure whereby said hollow trench-like structure and subsequent airgap pinch-off is achieved by first depositing a layer onto the substrate and create openings in said layers such that a hollow trench-like structure is achieved using a pulsed etching technique comprising alternating steps of isotropic etching and passivation through said openings and the pinch-off is achieved by depositing a thin sealing liner.
Figure 9B:
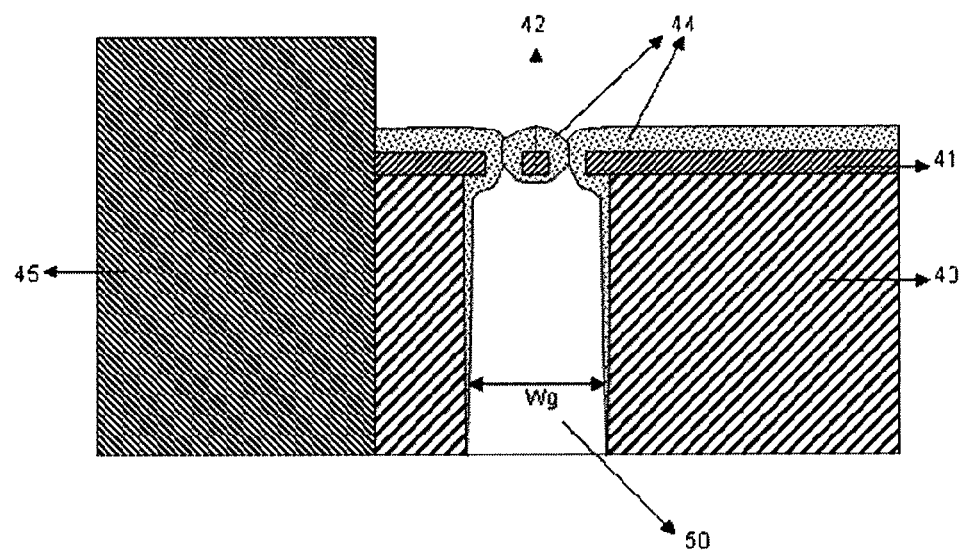
Figure 10A:
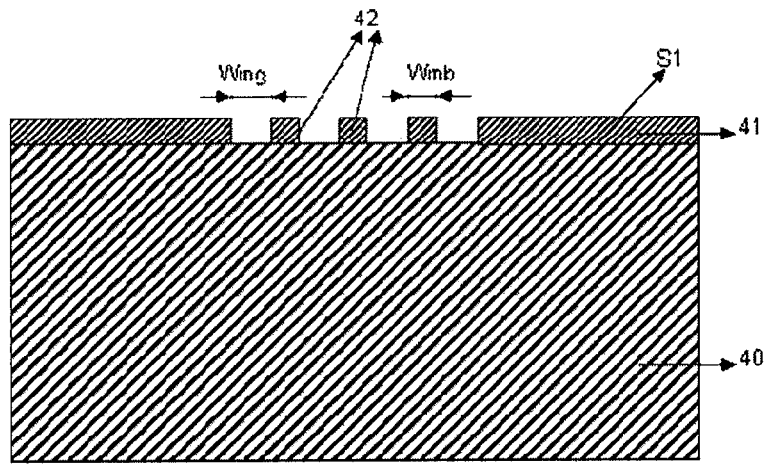
FIGS. 10A-10D illustrate processing steps to fabricate a surrounding trench-like (ring) structure comprising an airgap according to preferred embodiments of the present disclosure using a pulsed etching technique comprising alternating steps of isotropic etching and passivation and wherein said steps are repeated until the desired depth of the (hollow) structure is reached and whereby the airgap pinch-off is achieved by depositing a liner.
Figure 10B:
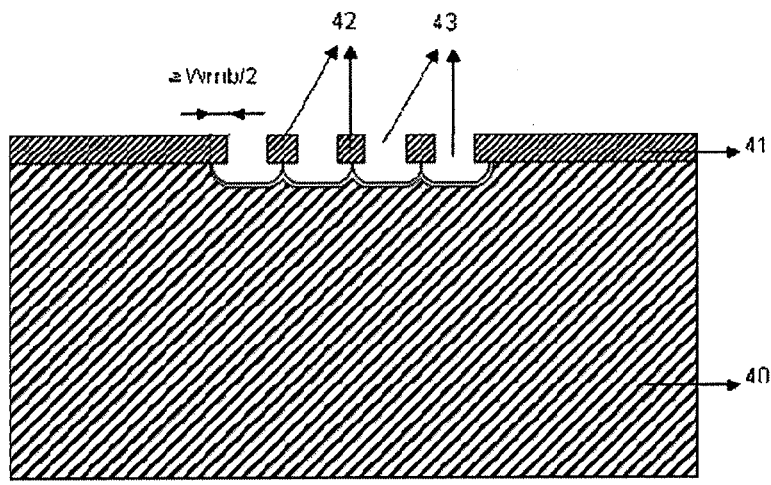
Figure 10C:
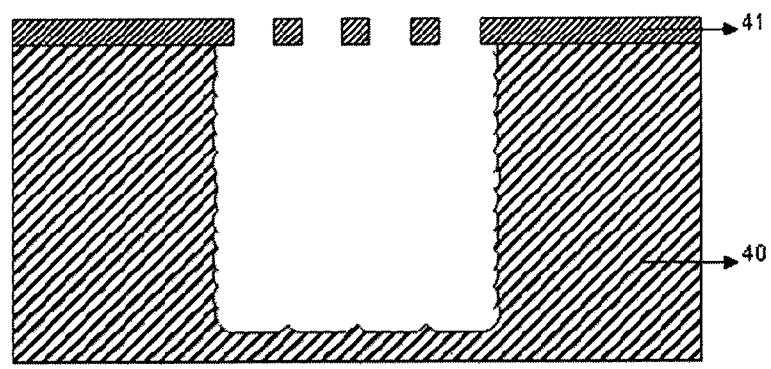
Figure 10D:
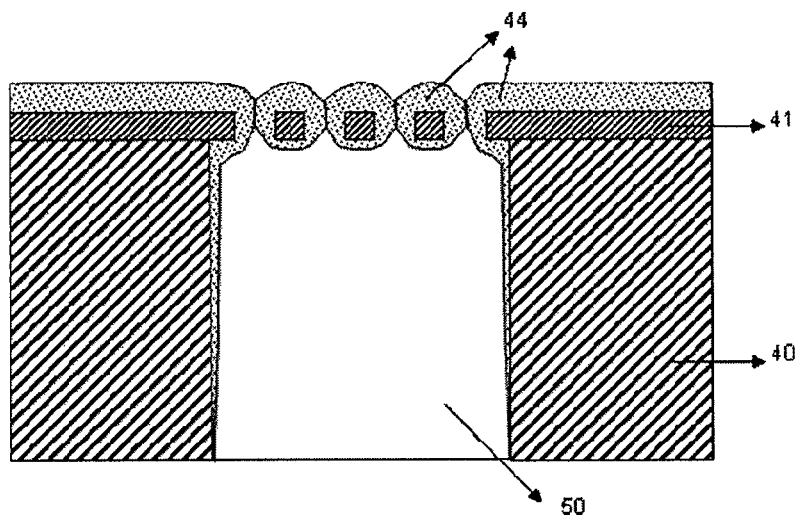
Figure 13C:
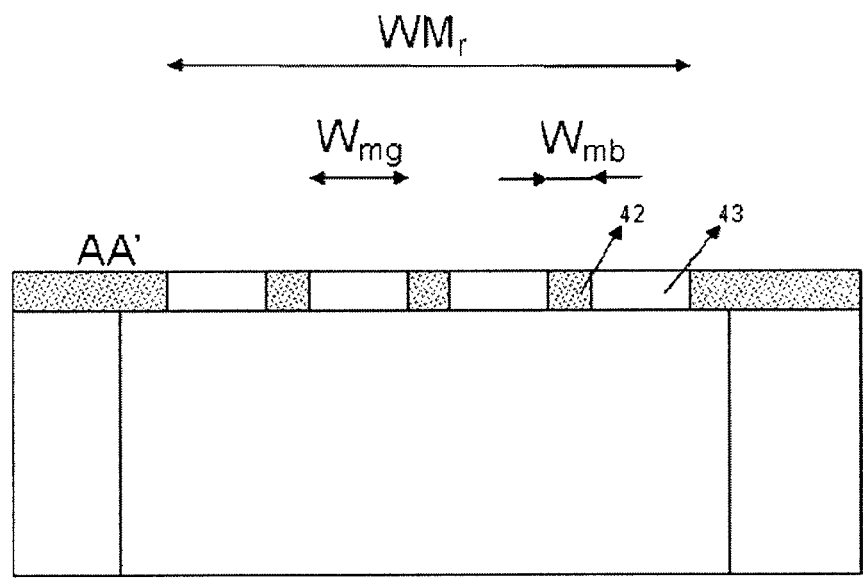
Figure 14:
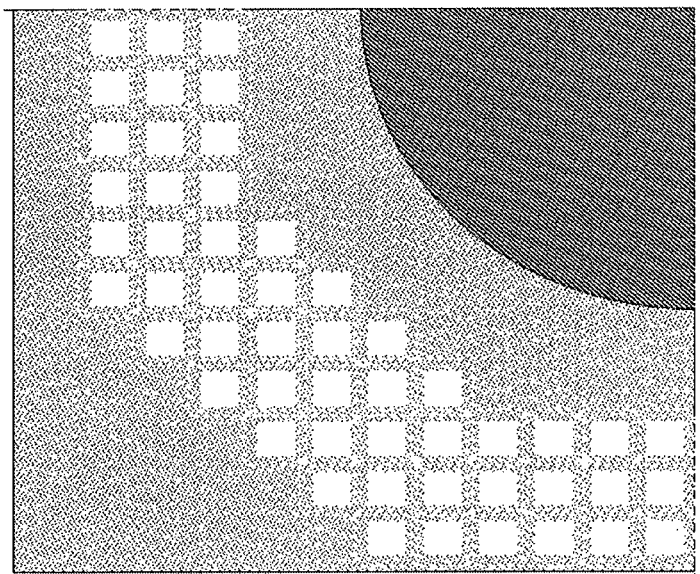
FIG. 14 and FIG. 15 illustrate a detailed view on the layer with defined openings suitable for using the pulsed etching technique to create a hollow trench-like structure according to a preferred embodiment of the present disclosure whereby all the openings have equal dimensions (iso-width) $W_b$ and the openings are organized in a form specifically preferred and suitable for lithographic patterning of the openings (octagonal ring shape).
Figure 15:
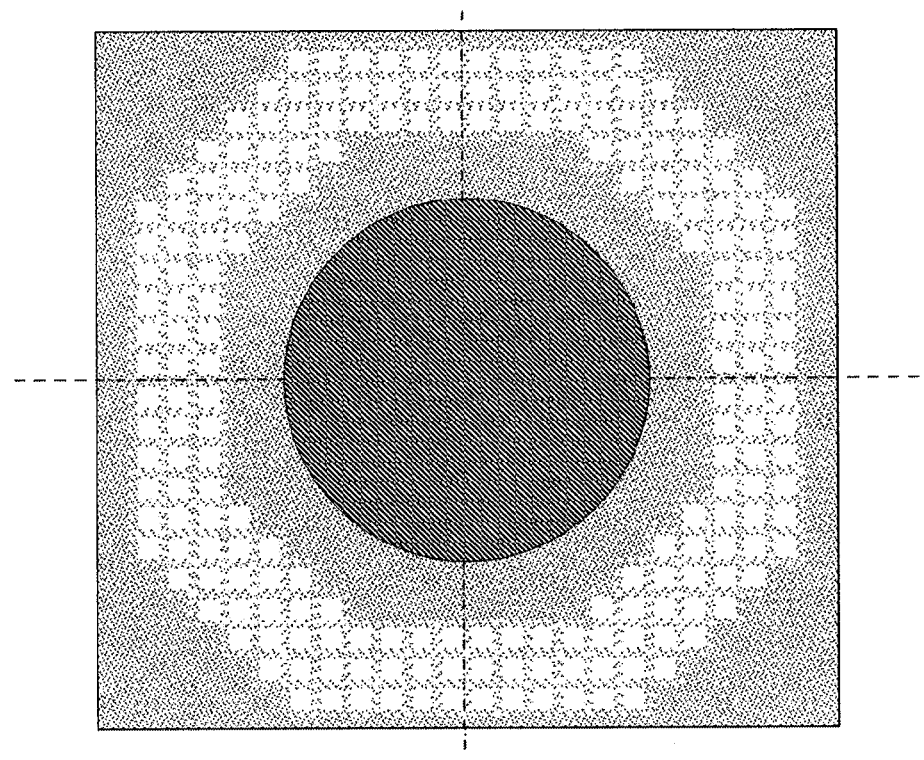

According to alternative and also preferred embodiments the trench-like structure (R1) is achieved by first depositing a layer (41) onto the substrate (40) and create openings (43) in said layer such that a hollow trench-like structure (R1) can be achieved by removing substrate material through said openings (43) using a pulsed etching technique comprising alternating steps of isotropic etching and passivation through said openings. The layer (41) in which openings (43) are created is preferably a RIE mask layer deposition such as an oxide or nitride comprising layer. FIGS. 12 and 13 illustrates the radial distribution of the openings in order to create a hollow trench-like ring structure using the pulsed etching technique. FIGS. 9A and 9B illustrate the subsequent sealing or closure of the openings (43) in the deposited (mask) layer (41) in order to create an airgap (pinch-off). Said openings (43) are preferably closed after creation of the hollow trench-like (ring) structure (R1) by depositing an additional (sealing) layer (44) e.g. an oxide. The openings (43) in the deposited layer (41) have a predefined width $W_{mg}$ and the spacing $W_{mb}$ between the openings (43) is maximum 2 times the undercut (scallop) produced during the DRIE process, preferably less. Said undercut depends on the $W_{mg}$ and the DRIE recipe selected. Typically the larger the openings ($W_{mg}$) and the higher the etch rate, the higher the undercut will be.

According to a second aspect, the present disclosure is related to a method for fabrication an electrical interconnect structure, more specifically a 3D-TSV interconnect structure with improved (ultra-low) capacitance.

A general overview of method steps of a method according to embodiments of the present disclosure for the fabrication of the electrical interconnects in a substrate (1) are illustrated in FIG. 7A-7F. These drawings are cross-sections through the substrate (1) in a direction perpendicular to a main surface (S1) of the substrate (1).

A process flow according to embodiments of the present disclosure preferably starts with the step of providing a substrate (1) made of substrate material, said substrate (1) having a first main surface (S1). Said first main surface is preferably the backside of a semiconductor wafer comprising active devices (chips) in the front (opposite) surface of the substrate. The substrate (1) can be a wafer or a processed wafer. It can contain microelectronics components, possibly bonded to a wafer. In particular embodiments, the substrate (1) is a semiconductor substrate. The substrate (1) may comprise silicon or conductive silicon (for example realized by implantation), and in particular embodiments may be a silicon substrate or a conductive silicon substrate.

The substrate (1) may comprise electronic or MEMS devices. In certain embodiments of the present disclosure, the substrate (1) is a semiconductor wafer or die comprising a back-end-of-line (BEOL) and a front-end-of-line (FEOL), wherein the first main surface (S1) is the backside of the wafer or die, i.e. the side which is most remote from the BEOL (13) as illustrated in FIG. 3A-3B. The substrate thickness (e.g. after thinning the substrate beforehand) may be between 10 μm and 500 μm, for example between 20 μm and 300 μm, e.g. between 20 μm and 100 μm. In particular embodiments, the substrate thickness may be about 50 μm.

Figure 7A:
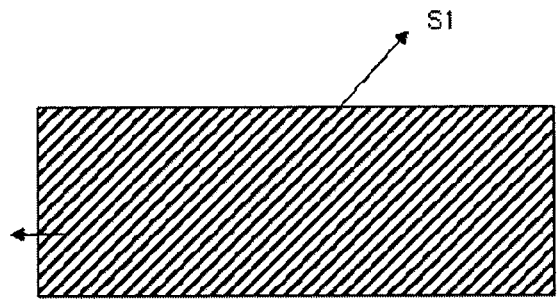
FIGS. 7A-7F illustrate different processing steps according to a preferred embodiment of the present disclosure to fabricate a Through Silicon Via (TSV) interconnect in the form of a conductive inner pillar structure with a trench-like surrounding structure comprising an airgap and an additional surrounding structure situated in between said TSV and trench-like surrounding structure with airgap.
Figure 7B:
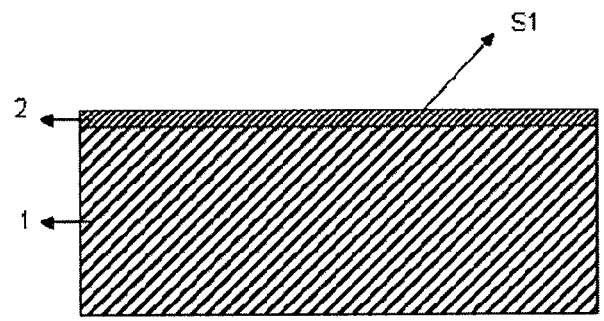
Figure 7C:
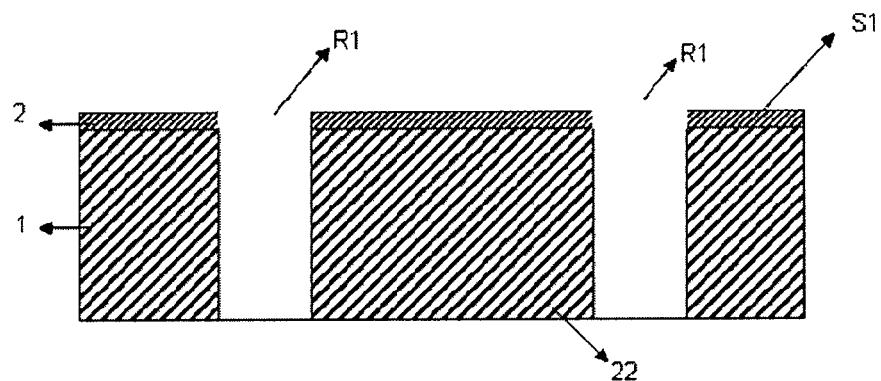

In a next step a hollow trench-like structure (R1) is provided, preferably a trench like structure in the form of a ring (R1), in the substrate (1) at the side of the first main surface (S1). This can be done in one set of examples by providing a photoresist layer and/or a mask layer (2) on the first main surface (S1) in which a trench-like (ring) structure (R1) can be defined, e.g. by using state of the art lithography techniques on the first main surface (S1). Then the trench-like (ring) structure (R1) is fabricated in the substrate (1) by removing substrate material, e.g. by etching a trench, preferably a circular-like trench, in the substrate (1) e.g. Si substrate etch thus producing an inner pillar structure (22) of substrate material (22). The hollow trench-like structure (R1) is preferably produced in the substrate (1) from the first main surface (S1) towards a second main surface (S2) opposite the first main surface (S1), the hollow trench-like (ring) structure (R1) surrounding an inner pillar structure (22) of substrate material as illustrated in FIG. 7C. Said hollow trench like structure (R1) does advantageously not extend down to the second surface (S2), such that the structure (R1) has a bottom surface as illustrated in FIGS. 3A and 4A. Alternatively, a process step for closing a through substrate trench like structure at the bottom also may be provided. The hollow trench like structure (R1) may be produced by etching the substrate (1), e.g. through a mask or by lithography. The etching of the substrate (1) may for example be performed by dry etching and/or wet etching. In particular embodiments Deep Reactive Ion Etching-Inductive Coupled Plasma (DRIE-ICP) may be used. In particular embodiments the hollow trench-like structure (R1) has a constant width. In particular embodiments the hollow trench-like structure (R1) is defined in the plane of the first main surface (S1) by 2 concentrically circles and is further defined in the direction orthogonal to the first main surface (S1) by an inner and an outer sidewall (32, 33) corresponding to the trench-like structures (see FIGS. 5 and 6). The width of trench-like structures (R1) is defined by the average distance between the 2 sidewalls (32, 33). The width $W_g$ of the hollow trench-like (ring) structure (R1) is predetermined such that the dimensions are optimal for the subsequent pinch-off conditions for airgap creation. Said surrounding trench-like structure preferably has a width Wg in the range of 0.5 μm up to 5 μm, more preferably below 2 μm.

Figure 7D:
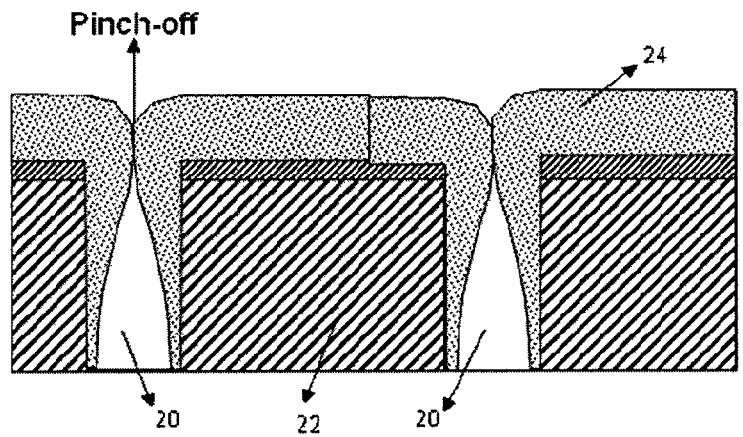

In a next step, as illustrated in FIG. 7D, a liner (24) and preferably a dielectric liner (24), is deposited onto the surface (S1) of the substrate (1). Said liner deposition is such that it pinches off the hollow trench-like (ring) structure (R1) at least at the surface (S1) of the substrate (1) and preferably at a level below the surface (S1) of the substrate (1) such that an airgap (20) is created in the center of the (ring) structure (R1) thereby forming e.g. an airgap ring. FIG. 8A illustrates more in detail the deposition of the dielectric liner and resulting pinch-off. The dielectric liner material should at least partially cover the upper part of the sidewall of the hollow trench like (ring) structure (R1). To achieve pinch-off at the top of the hollow trench like (ring) structure (R1) to form an airgap (20), the deposited dielectric liner (24) should have a minimal thickness $W_{dx}$ larger than halve the maximum width of the airgap trench $W_g$ resulting in $W_{dx} \geq W_g/2$. The formation of the pinch-off in order to create an air-gap typically requires a vertical deposition thickness $W_{dy}$ of the dielectric material in excess of the airgap width $W_g$. For wider airgaps, e.g. several μm wide, this results in a relatively thick vertical dielectric liner thickness $W_{dy}$. The sidewalls of the trench structure may be fully or partially covered by the material used to pinch-off the airgap.

The pinch-off point may be further optimized by providing a trench-like structure (R1) having sloped sidewalls as illustrated in FIG. 8B in order to position the airgap pinch-off by the liner material deeper in the trench and to avoid pinch-off at a level above the substrate surface (S1) thereby requiring a smaller lateral dielectric liner thickness $W_{dy}$. As an example a 6 μm dielectric (e.g. oxide) deposition can pinch-off a trench-like structure with straight sidewalls having $W_g$ of around 5 μm.

Figure 7E:
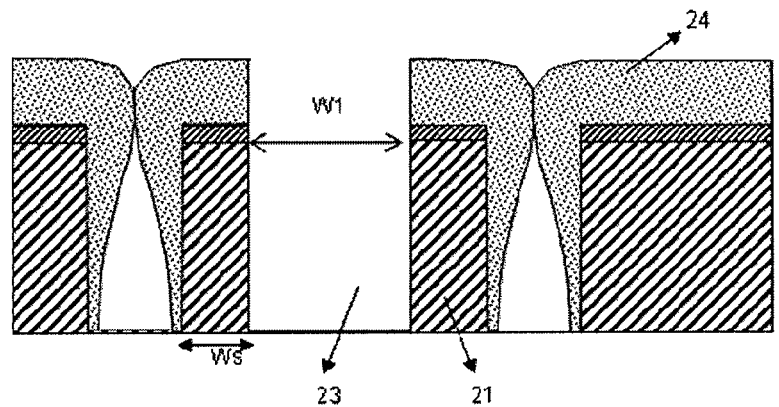
Figure 7F:
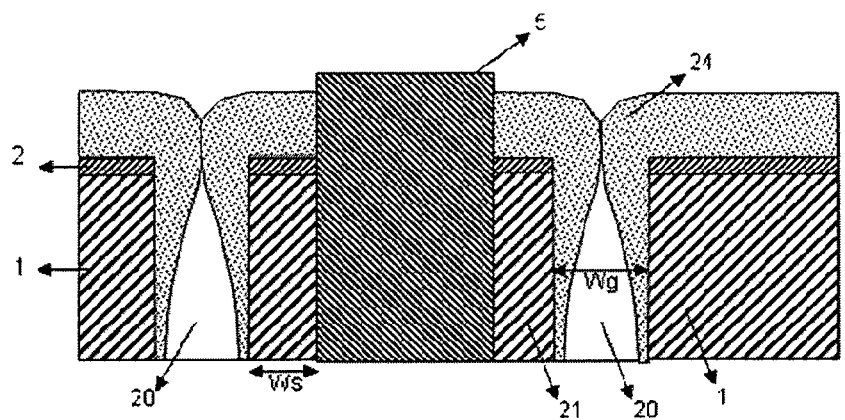

In a next step, as illustrated in FIG. 7E, a hole (23) is created in the inner pillar (22) thereby creating a Through Silicon Via (TSV) hole (23) having a bottom and sidewalls. Said TSV hole (23) is then at least partly filled with a conductive material thereby creating an electrical interconnect structure (5) suitable for forming an electrical path from the bottom surface of the hole up until the surface of the substrate (1) as illustrated in FIG. 7F. The dielectric liner material (24) can be patterned so as to free at least the location of the substrate pillar structure (22), removing, e.g. etching away, the substrate pillar structure (22), e.g. silicon substrate or silicon substrate further comprising ILD layer, thus leaving a pillar vacancy (23).

According to preferred embodiments and as illustrated in FIG. 7E the width W1 (diameter) of the TSV hole (23) is such that there is still substrate material left behind the surrounding trench-like (ring) structure (R1) comprising an airgap (20) and the created TSV hole (23). In this way an additional surrounding (ring) structure (21) is created around the TSV hole (23) thereby giving rise to a (first) surrounding trench-like structure (R1) with an airgap (20) and an additional (second) surrounding structure made of substrate material (21) surrounding the via hole (23). The additional surrounding structure made of substrate material (21) surrounding the TSV hole (23) can be circular or more oval in cross-section substantially parallel with the first surface of the substrate, or can even have a shape with corners or rounded corners (for example can be a square, a hexagon, or more generally a polygon; the polygon shapes can be regular or irregular . . . ) as illustrated in FIGS. 6A and 6B. Alternatively, the surrounding material could be dielectric material, e.g. from the liner used for generating the air gap. In all of the embodiments, at least some material surrounding the hole is present between the airgap created in the trench-like structure and the TSV hole.

As illustrated in FIG. 7F, a conducting inner pillar structure is created within the hole (23), more specifically within the Through Silicon Via (TSV) hole (23). The filling of the pillar vacancy (23) with conductive material may be performed e.g. by metalizing the vacancy (23). Electrochemical Deposition (ECD, also referred to as "plating") or alternatively Chemical Vapor deposition (CVD) may be used to deposit a conductive material. The conductive material is preferably selected from the group consisting of conductive silicon, Cu, Al, and W (and alloys of these metals) and optionally comprises a seed layer. Also alternative conductive materials may be used such as an implanted semiconductor, conductive silicon, conducting polymers, carbon nanotubes. Alternatively a metal paste consisting of metallic particles and organic binders, e.g. Ag paste, can be applied. Alternatively Carbon nano tubes (CNT) and combination of CNT and Cu can be applied.

Before filling the (TSV) hole with conductive material a barrier material (layer) may be deposited onto the inner sidewalls of the (TSV) hole (23). Said barrier material is preferably selected from materials such as Ta, Ti, TaN, TiN, RuTa. TiW deposited by state of the art deposition techniques such as PVD and CVD and combinations thereof.

Figure 11A:
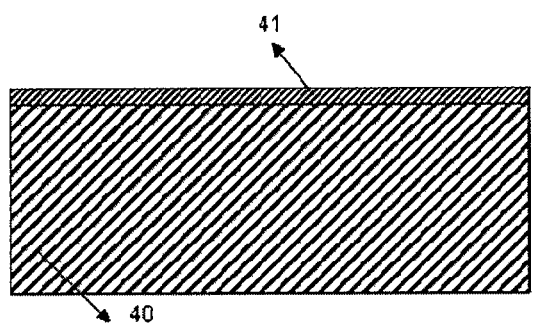
Figure 11B:
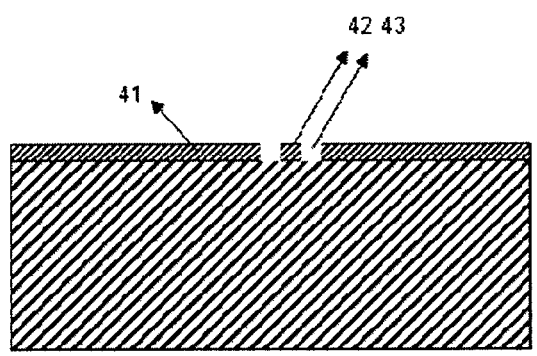
Figure 11C:
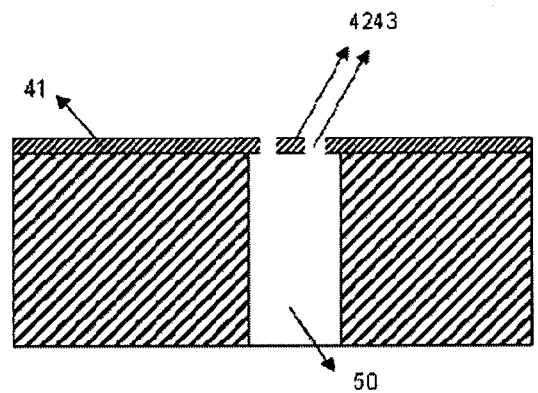
Figure 11D:
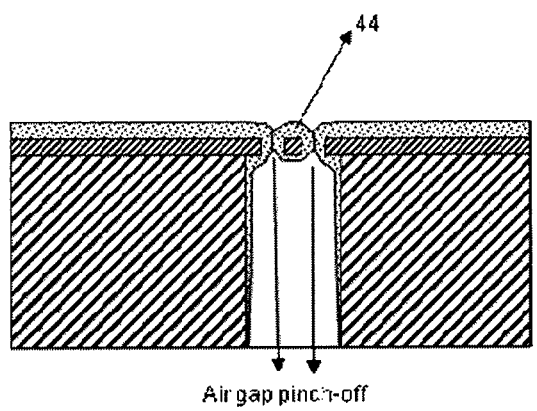
Figure 11E:
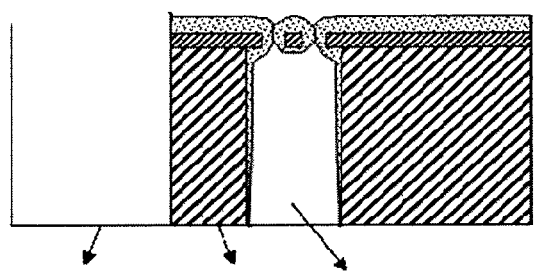

According to alternative and also preferred embodiments the hollow trench-like (ring) structure (R1) is created by an alternative method as illustrated in FIG. 10A-10D and FIG. 11A-11F using a pulsed etching technique comprising alternating steps of isotropic etching and passivation (also referred to as "The Bosch process"). The trench-like structure (R1) is created by first depositing a mask layer (41) on the first main surface (S1) of the substrate (40) as illustrated in FIG. 11A and then defining openings (43) in said mask layer (41) using e.g. state of the art lithography techniques. The openings (43) in the deposited layer (41) have a predefined width $W_{mg}$ and the spacing $W_{mb}$ between the openings (43) is maximum 2 times the undercut (scallop) produced during the DRIE process, preferably less. Said undercut depends on the $W_{mg}$ and the DRIE recipe selected. Typically the larger the openings ($W_{mg}$) and the higher the etch rate, the higher the undercut will be. FIGS. 12 and 13 illustrate the relative width of the openings (43). There can be at least two opening as illustrated in FIG. 9B or alternatively there can be several openings as illustrated in FIG. 9A. In any case the openings and remaining mask layer should be such that an optimum undercut during the pulsed etching technique is achieved and hence complete removal of substrate material is achieved in order to create only 1 opening (instead of several). The trench-like (ring) structure (R1) is fabricated in the substrate (40) by removing substrate material through the openings (43). The alternating steps of isotropic etching and passivation are repeated until the desired depth is achieved. After creation of the trench-like (ring) structure (R1) the openings (43) in the mask layer (41) are closed (sealed) by depositing an additional layer (44) e.g. an oxide such that an airgap (50) is created. This processing sequence has the advantage that a thinner dielectric liner (oxide/nitride) will be sufficient for air-gap pinch-off or in other words less sealing material (44) is needed to close the small holes in the mask layer (41). It hence has the advantage that e.g. for wider trench-like structures (R1), e.g. several µm wide, it avoids the need to deposit a relatively thick oxide layer to seal/close the airgap (50). It further has the advantage that the pinch-off point is less of an issue for sealing the airgap (50).

Figure 4B:
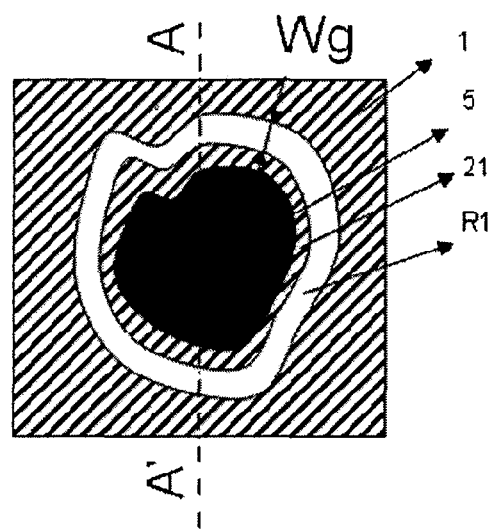

According to preferred embodiments (not shown in the drawings) the substrate (1) may comprise at least one layer comprising a different material than the rest of the substrate (1) that can be part of the substrate, and may have to be removed partially, for example at the bottom of the inner pillar structure (23 or 50), for example to realize electrical contact with underlying devices, e.g. a PMD layer as illustrated in FIGS. 3 and 4. Removing the at least one layer comprising different material can mean e.g., etching it away when removing the inner pillar structure (22). This may occur in one single process, e.g., one single etch step together with the other materials present in the pillar structure (22), or may be performed in different subsequent steps (etching sub-processes), depending on the materials present in the inner pillar structure (22). Each step can be adapted for selectively removing a substrate pillar sub-layer or subsequent sub-layers (for example by changing the etch chemistry in case of dry and/or wet etching. A typical example of such a layer is an inter level dielectric (ILD) layer, which is a layer present in a back-end-of-line (BEOL) interconnect structure; having a function of electrically isolating the metal interconnects in the BEOL from for example the front-end-of-line (FEOL). Typical ILD layers or ILD materials are an oxide, e.g. silicon oxide, PSG, SiC, SiN, Tetraethooxysilane (TEOS) Oxide, low-k dielectrics, polymers as BCB or polyimide (epoxy based polymers can be added).

The method according to embodiments of the present disclosure may further comprise thinning the substrate (1) beforehand (before creation of the trench-like structure and TSV interconnects) from a second main surface (S2) opposite the first main surface (S1).

In embodiments of the present disclosure, the thinning can be performed by for instance mechanical operations such as grinding or other state of the art techniques. According to alternative embodiments of the present disclosure, the thinning may comprise chemically thinning, e.g. by dry/wet etching or plasma etching the substrate (1) from the second main surface (S2).

Also, according to yet other embodiments, the chemical thinning, e.g. plasma etching, may not stop at the level where the conductive structure (5) is reached, but may continue above that level (thus slightly over etching the substrate (1), e.g. silicon substrate). The interconnect structure (the conducting material (5) or the combined conductive material (5) and dielectric (24)) will then stick out of the etched-back surface, which is advantageous for the addition of a solder volume such as a solder ball or bump. A solder volume as for instance a solder ball or solder bump can further be applied to the conductive structure on the second surface.

While the disclosure has been illustrated and described in detail in the drawings and foregoing description, such illustration and description are to be considered illustrative or exemplary and not restrictive. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

What is claimed is:

1. A method for the fabrication of at least one electrical interconnect in a substrate, comprising:

providing a substrate comprising a substrate material and having a first main surface;

producing at least one hollow trench-like structure in the substrate from the first main surface, the trench-like structure surrounding an inner pillar structure of the substrate material, wherein the hollow trench-like structure has sloped sidewalls such that an upper width of the hollow trench-like structure is larger than a lower width of the hollow trench-like structure;

depositing a dielectric liner which pinches off the hollow trench-like structure at the first main surface such that an airgap is created in the center of hollow trench-like structure, wherein an airgap pinch-off by the dielectric liner is positioned below the first main surface; thereafter creating a hole in the inner pillar, thereby creating a through silicon via hole having a bottom surface and an additional surrounding structure made of a material which is situated in between the through silicon via hole and the airgap in the trench-like structure; and at least partly filling the through silicon via hole with a conductive material, thereby creating an electrical interconnect structure forming an electrical path from the bottom surface of the through silicon via hole up to the first main surface of the substrate.

2. The method according to claim 1, wherein depositing a dielectric liner comprises depositing a dielectric liner which pinches off the hollow trench-like structure at the first main surface such that an airgap surrounding the electrical interconnect structure to be formed is created.

3. The method according to claim 1, wherein before producing the at least one hollow trench-like structure, a layer is deposited having a plurality of openings with a width $W_{mg}$ and a spacing $W_{mb}$ between the openings, wherein the hollow trench-like structure is created by etching through the openings of the layer using an alternating isotropic etching-passivation process, and wherein etching is repeated until a desired depth of the trench-like structure is reached.

4. The method according to claim 3, wherein the alternating isotropic etching-passivation process comprises etching with a plasma comprising $SF_6$ alternated with passivation with a plasma comprising $C_4F_8$.

5. The method according to claim 1, wherein a minimal lateral thickness of the deposited dielectric liner $W_{dy}$ is larger than half of a maximum width of a hollow part of the trench-like structure ½ $W_g$.

6. The method according to claim 1, wherein producing at least one hollow trench-like structure in the substrate is achieved by providing at least one photosensitive layer and/or a mask layer on the first main surface in which the hollow trench-like structure is defined using a combination of lithography and reactive ion etching.

7. The method according to claim 1, wherein at least partly filling the through silicon via hole with a conductive material is performed by filling the through silicon via hole with a material selected from the group consisting of a metal, a metal alloy, an implanted semiconductor material, a conductive silicon, a conducting polymer, carbon nanotubes, a metal paste, and combinations thereof, and wherein at least partly filling the through silicon via hole with a conductive material is performed using electrochemical deposition or chemical vapor deposition.

8. The method according to claim 1, wherein the substrate is thinned from a second main surface opposite the first main surface.

9. The method according to claim 1, wherein creating a through silicon via hole comprises creating a through silicon via hole having an additional surrounding structure comprising substrate material which is situated in between the through silicon via hole and the trench-like structure.

10. A substrate, the substrate comprising:
 at least one electrical interconnect structure in a form of a conductive inner pillar structure situated in a substrate; and
 a trench-like structure surrounding the interconnect structure, the trench-like structure comprising an airgap and a sealing material which pinches off the airgap on the first surface, wherein the trench-like structure has sloped sidewalls such that an upper width of the trench-like structure is larger than a lower width of the trench-like structure, and wherein an airgap pinch-off by the dielectric liner is positioned below a surface of the substrate.

11. The method according to claim 1, further comprising chemical mechanical polishing to remove dielectric liner material from a field area above the airgap without opening the airgap.

12. The method according to claim 3, wherein the plurality of openings are closed after producing the at least one hollow trench-like structure by depositing an additional sealing layer, and wherein the width $W_{mg}$ and the spacing $W_{mb}$ are each less than or equal to two times an undercut produced during the alternating isotropic etching-passivation process.

13. The method according to claim 1, wherein the additional surrounding structure has a thickness $W_G$ larger than 100 nm, wherein the trench-like structure has a width smaller than 20 μm, and wherein a distance from the bottom surface of the through silicon via hole up to the first main surface of the substrate is from 150 μm to 725 μm.

14. The substrate according to claim 10, wherein the airgap surrounds the electrical interconnect structure.

15. The substrate according to claim 10, further comprising an additional surrounding structure comprising a substrate material which is situated in between the interconnect structure and the trench-like structure, and which has a thickness $W_G$ larger than 100 nm.

16. The substrate according to claim 10, wherein the trench-like structure (R1) has a width smaller than 20 μm.

17. The substrate according to claim 10, wherein the conductive pillar is a through silicon via, and comprises a material selected from the group consisting of a metal, a metal alloy, an implanted semiconductor material, a conductive silicon, carbon nanotubes, a conducting polymer, a metal paste, and combinations thereof.

18. The substrate according to claim 10, wherein the substrate comprises at least one of a barrier material or a seed material, wherein the at least one of a barrier material or a seed material is situated on outer sidewalls of the conductive pillar.

19. The substrate according to claim 10, wherein the sealing material is a nitride or an oxide deposited using plasma enhanced chemical vapor deposition.

20. The substrate according to claim 10, wherein the sealing material is a nitride or an oxide deposited using plasma enhanced chemical vapor deposition conducted at a temperature <200° C.

21. A 3D stacked semiconductor device comprising the substrate of claim 10.

22. The substrate according to claim 10, further comprising at least one photosensitive layer and/or a mask layer atop a surface of the substrate, the at least one photosensitive layer and/or a mask layer comprising a plurality of openings with a width $W_{mg}$ and a spacing $W_{mb}$ between the opening, wherein the plurality of openings are closed by the sealing material, and wherein the width $W_{mg}$ and the spacing $W_{mb}$ are each less than or equal to two times an undercut of the trench-like structure.

23. The substrate according to claim 10, wherein a distance from the bottom surface of the through silicon via hole up to the first main surface of the substrate is from 150 μm to 725 μm.

* * * * *

UNITED STATES PATENT AND TRADEMARK OFFICE
CERTIFICATE OF CORRECTION

| | |
|---|---|
| PATENT NO. | : 8,647,920 B2 |
| APPLICATION NO. | : 13/183315 |
| DATED | : February 11, 2014 |
| INVENTOR(S) | : Tezcan et al. |

It is certified that error appears in the above-identified patent and that said Letters Patent is hereby corrected as shown below:

In the Specification

Column 1 line 17, Change "Vias" to --Via--.

Column 4 line 30, Change "Bossch" to --Bosch--.

Column 5 line 35, Change "FIGS. 1B" to --FIGS. 1A--.

Column 13 line 57, Change "Tetraethooxysilane" to --Tetraethoxysilane--.

In the Claims

Column 16 line 12, In Claim 13, change "$W_G$" to --$W_g$--.

Column 16 line 23, In Claim 15, change "$W_G$" to --$W_g$--.

Column 16 line 27, In Claim 17, change "via," to --via hole--.

Signed and Sealed this
Fourteenth Day of October, 2014

Michelle K. Lee
*Deputy Director of the United States Patent and Trademark Office*